(12) United States Patent
Ueda et al.

(10) Patent No.: US 12,538,420 B2
(45) Date of Patent: Jan. 27, 2026

(54) COPPER CLAD LAMINATE AND PRINTED WIRING BOARD

(71) Applicant: Sony Group Corporation, Tokyo (JP)

(72) Inventors: Kenji Ueda, Tokyo (JP); Fumikatsu Uesawa, Tokyo (JP); Osamu Maki, Tokyo (JP); Yoshiyuki Nomura, Tokyo (JP)

(73) Assignee: Sony Group Corporation, Tokyo (JP)

( * ) Notice: Subject to any disclaimer, the term of this patent is extended or adjusted under 35 U.S.C. 154(b) by 262 days.

(21) Appl. No.: 18/294,293

(22) PCT Filed: Mar. 15, 2022

(86) PCT No.: PCT/JP2022/011596
§ 371 (c)(1),
(2) Date: Feb. 1, 2024

(87) PCT Pub. No.: WO2023/013133
PCT Pub. Date: Feb. 9, 2023

(65) Prior Publication Data
US 2024/0349422 A1    Oct. 17, 2024

(30) Foreign Application Priority Data
Aug. 6, 2021  (JP) .................. 2021-129541

(51) Int. Cl.
*H05K 1/03* (2006.01)
*B32B 15/09* (2006.01)
*C08L 101/16* (2006.01)
*H05K 1/02* (2006.01)
*H05K 3/02* (2006.01)

(52) U.S. Cl.
CPC ............... *H05K 1/03* (2013.01); *B32B 15/09* (2013.01); *C08L 101/16* (2013.01); *H05K 1/0271* (2013.01); *H05K 3/025* (2013.01); *H05K 2201/0355* (2013.01); *H05K 2203/178* (2013.01)

(58) Field of Classification Search
CPC ......... B32B 15/09; B32B 27/36; C08L 67/04; H05K 1/03; H05K 1/0313; H05K 1/032; H05K 1/0353; H05K 1/036; H05K 1/0366; H05K 1/0373
See application file for complete search history.

(56) References Cited

U.S. PATENT DOCUMENTS

2018/0291196 A1* 10/2018 Terada ............... C08J 3/203

FOREIGN PATENT DOCUMENTS

| CN | 106519608 A | * | 3/2017 | ............. C08L 67/04 |
| JP | 2008031296 A | | 2/2008 | |
| JP | 2013028162 A | | 2/2013 | |
| JP | 2017101092 A | | 6/2017 | |
| JP | 2020122189 A | | 8/2020 | |
| WO | 2013144420 A1 | | 10/2013 | |

OTHER PUBLICATIONS

Machine translation of CN 106519608A (Year: 2017).*
Machine translation of JP 2017-101092 (Year: 2017).*
International Search Report from corresponding PCT application PCT/JP2022/011596, dated Jun. 7, 2022.

* cited by examiner

*Primary Examiner* — Zachary M Davis
(74) *Attorney, Agent, or Firm* — K&L Gates LLP

(57) ABSTRACT

An object of the present technology is to provide a copper clad laminate including a resin substrate that has biodegradability and less likely to warp or crack. The present technology provides a copper clad laminate including: a resin substrate; an adhesive layer; and a copper foil layer, the adhesive layer and the copper foil layer being stacked in this order on at least one side of the resin substrate, the resin substrate containing at least 50 mass % or more of polylactic acid, the degree of crystallization of the polylactic acid calculated on a basis of a result of differential scanning calorimetry being 29% or more and 36% or less, a crystallite size of the polylactic acid calculated on a basis of a result of X-ray diffraction measurement being 19 nm or more and 26 nm or less. Further, the present technology provides a printed wiring board formed using the copper clad laminate.

5 Claims, No Drawings

COPPER CLAD LAMINATE AND PRINTED WIRING BOARD

TECHNICAL FIELD

The present technology relates to a copper clad laminate and a printed wiring board.

BACKGROUND ART

In the past, various technologies regarding a copper clad laminate for a printed wiring board including a resin substrate have been proposed (e.g., the following Patent Literature 1). The material of the resin substrate generally includes a non-biodegradable resin. A printed wiring board prepared using a copper clad laminate that includes a resin substrate containing a non-biodegradable resin has been used in many electrical products.

Printed wiring boards included in the above electrical products (particularly, electrical products installed outdoors) can be leaked into the natural environment due to unforeseen circumstances such as accidents and disasters. In this case, the resin substrates in the printed wiring boards can remain in the natural environment without being biodegraded. As a result, there is a possibility that a burden is caused on the natural environment.

CITATION LIST

Patent Literature

Patent Literature 1: Japanese Patent Application Laid-open No. 2020-122189

DISCLOSURE OF INVENTION

Technical Problem

In order to reduce the burden on the natural environment when a copper clad laminate including a resin substrate has leaked into the natural environment, it is desirable that the resin substrate has biodegradability. However, when a biodegradable resin is used as a material to impart biodegradability to the resin substrate, the resin substrate can warp and/or crack.

In this regard, a main object of the present technology is to provide a copper clad laminate including a resin substrate that has biodegradability and less likely to warp or crack.

Solution to Problem

The present technology provides a copper clad laminate including: a resin substrate; an adhesive layer; and a copper foil layer, the adhesive layer and the copper foil layer being stacked in this order on at least one side of the resin substrate, the resin substrate containing at least 50 mass % or more of polylactic acid, the degree of crystallization of the polylactic acid calculated on a basis of a result of differential scanning calorimetry being 29% or more and 36% or less, a crystallite size of the polylactic acid calculated on a basis of a result of X-ray diffraction measurement being 19 nm or more and 26 nm or less. The degree of crystallization of the polylactic acid may be 30% or more and 35% or less.

The crystallite size of the polylactic acid may be 20 nm or more and 25 nm or less.

The resin substrate may be an injection molded body.

The present technology also provides a printed wiring board formed using the copper clad laminate.

MODE(S) FOR CARRYING OUT THE INVENTION

A suitable embodiment for carrying out the present technology will be described below. Note that the embodiment described below show a typical embodiment of the present technology, and the scope of the present technology is not limited only to the embodiment. Description of the present technology will be made in the following order.

1. Copper clad laminate
1-1. Entire configuration
1-2. Resin substrate
1-3. Adhesive layer
1-4. Copper foil layer
1-5. Method of producing copper clad laminate
2. Printed wiring board
3. Conclusion
4. Examples

1. Copper Clad Laminate 1-1. Entire Configuration

A copper clad laminate according to an embodiment of the present technology includes: a resin substrate; an adhesive layer; and a copper foil layer, the adhesive layer and the copper foil layer being stacked in this order on at least one side of the resin substrate. That is, in the copper clad laminate according to this embodiment, the adhesive layer and the copper foil layer may be stacked in this order on only one side of the resin substrate, and the adhesive layer and the copper foil layer may be stacked in this order on both sides of the resin substrate. In the present specification, a copper clad laminate including an adhesive layer and a copper foil layer on only one side of a resin substrate will be referred to also as a single-sided copper clad laminate, and a copper clad laminate including an adhesive layer and a copper foil layer on both surfaces of a resin substrate will be referred to also as a double-sided copper clad laminate. The resin substrate, the adhesive layer, and the copper foil layer will be described below.

1-2. Resin Substrate 1-2-1. Material of Resin Substrate

The resin substrate included in the copper clad laminate according to this embodiment contains at least 50 mass % or more of polylactic acid. That is, the resin substrate is formed using a resin material containing at least 50 mass % or more of polylactic acid. Polylactic acid is known as one type of biodegradable resin. By using polylactic acid as a material of the resin substrate, a resin substrate having biodegradability can be obtained. Note that in the present specification, a "resin substrate having biodegradability" means that at least part of the material used for the resin substrate is a biodegradable material.

The polylactic acid contained in the resin substrate is a polymer having lactic acid as a constituent unit. Examples of the polylactic acid include poly-L-lactic acid (PLLA) that is a homopolymer of L-lactic acid, poly-D-lactic acid (PDLA), that is a homopolymer of D-lactic acid, poly-DL-lactic acid (PDLLA) that is a random copolymer of L-lactic acid and D-lactic acid, a block copolymer of L-lactic acid and D-lactic acid, and stereocomplex-type poly(lactic acid) (sc-PLA)

formed of equal amounts of poly-L-lactic acid and poly-D-lactic acid. Further, the polylactic acid may contain, for example, a constituent unit other than lactic acid within a range that does not impair the biodegradability. The polylactic acid may be, for example, a copolymer of lactic acid and a monomer other than lactic acid, which has biodegradability.

The polylactic acid contained in the resin substrate is favorably poly-L-lactic acid, or a copolymer of L-lactic acid and D-lactic acid. The optical purity of L-lactic acid in the polylactic acid may be, for example, 90% or more, 95% or more, or 99% or more. The higher the optical purity of the L-lactic acid, the better the heat resistance, and a resin substrate that is less likely to warp or crack when used as a member of the copper clad laminate can be obtained.

The content ratio of polylactic acid in the resin substrate is at least 50 mass % or more, favorably 60 mass % or more, more favorably 70 mass % or more, still more favorably 80 mass % or more, particularly favorably 90 mass % or more, 95 mass % or more, or 100 mass %. As described above, the resin substrate may contain materials other than polylactic acid and does not necessarily need to contain them. That is, the resin substrate may contain only polylactic acid. An increase in the content ratio of polylactic acid in the resin substrate can contribute to improvement in the biodegradability of the resin substrate.

Polylactic acid can impart biodegradability to the resin substrate as described above. However, when the resin substrate containing polylactic acid is used as a member of the copper clad laminate, the resin substrate heated during the process of producing the copper clad laminate warps or cracks in some cases. This is presumably due to the low heat resistance of polylactic acid and that fact that the amorphous portion crystalizes over time because polylactic acid is a crystalline resin. Since the warping or cracking of the resin substrate can cause defects in the copper clad laminate, the resin substrate containing polylactic acid is desired to be less likely to warp or crack.

Here, generally, in order to prepare a resin substrate in which the occurrence of warpage is suppressed, i.e., a resin substrate having high smoothness, the molding conditions for the resin substrate are adjusted in some cases. For example, in the case where a resin substrate is prepared by injection molding, the smoothness of the resin substrate is improved in some cases by adjusting the cooling temperature, cooling time, holding pressure, or holding time of the resin, or the like in order to suppress the occurrence of warpage. However, appropriate molding conditions (e.g., the cooling temperature, cooling time, holding pressure, and holding time) that can suppress the occurrence of warpage of the resin substrate can vary depending on the size and thickness of the resin substrate, or the like. Such a variation in appropriate molding conditions can occur not only in the injection molding described above but also in another molding method such as inflation molding and extrusion molding.

The present inventors have studied on a technology for suppressing the occurrence of warpage and cracking of a resin substrate containing polylactic acid. As a result, the present inventors have found that the molding conditions for a resin substrate that is less likely to warp or crack can vary not only depending on the size and thickness of the resin substrate described above but also depending on the grade of polylactic acid. As described above, since the molding conditions for a resin substrate that contains polylactic acid and is less likely to warp or crack are affected by various factors, it has not been easy to produce the resin substrate. In this regard, as a result of further studies, the present inventors have found that the warpage and cracking of the resin substrate can be suppressed by controlling polylactic acid used for the resin substrate to a specific degree of crystallization and a specific crystallite size, and completed the present technology. In accordance with the present technology, it is possible to efficiently produce a resin substrate that is less likely to warp or crack using numerical values of the degree of crystallization and crystallite size of polylactic acid used for the resin substrate as indices. Details of the degree of crystallization and crystallite size of polylactic acid will be described below.

In the copper clad laminate according to this embodiment, the degree of crystallization of polylactic acid is 29% or more and 36% or less, favorably 30% or more and 35% or less. In order to obtain a resin substrate that is less likely to warp or crack, such a degree of crystallization is favorable. The degree of crystallization of polylactic acid is the degree of crystallization calculated on the basis of a result of differential scanning calorimetry. The degree of crystallization is specifically calculated as follows. First, differential scanning calorimetry (DSC) measurement is performed on polylactic acid. In the DSC measurement, for example, a DSC measuring device (manufactured by PerkinElmer, inc., Diamond DSC) and an aluminum sample pan and cover (manufactured by PerkinElmer, inc., Sample pan kit, product number: 0219-0062) may be used. A reference sample in which a sample pan is sealed with a cover is set on the reference side of the DSC device, and a sample in which 5 mg to 10 mg of a sample resin containing polylactic acid is placed inside a sample pan and is sealed with a cover is set on the sample side of the DSC measuring device. DSC measurement is performed under the temperature conditions shown in the following Steps 1 to 4 in an atmosphere of a dry nitrogen flow rate of 20 mL/min.

Step 1: Left to stand for 5 minutes at −50° C.
Step 2: Increase temperature from −50° C. to 190° C. at a rate of 5° C./min
Step 3: Left to stand for 5 minutes at 190° C.
Step 4: Lower temperature from 190° C. to 10° C. at a rate of −20° C./min Next, the degree of crystallization of polylactic acid is calculated by the following formula from the DSC chart of the sample resin obtained in Step 2 of the DSC measurement described above. Note that in the following formula, the value of $\Delta H_{100\%}$ (heat of fusion of a polylactic acid crystal) is a theoretical value 93 J/g.

$$X_c = (\Delta H_m - \Delta H_c)/\Delta H_{100\%} \times 100$$

(in the formula, $X_c$ represents the degree of crystallization [%], $\Delta H_m$ represents the heat of fusion [J/g], $\Delta H_c$ represents the heat of crystallization [J/g], and $\Delta H_{100\%}$ represents the heat of fusion [J/g] of a polylactic acid crystal.)

In the above Step 2, when the amorphous portion undergoes secondary crystallization as the temperature increases, the heat of crystallization $\Delta H_c$ (heat generation) is observed. However, the secondary crystallization does not occur and the heat of crystallization $\Delta H_c$ is not observed in some cases depending on the state of the sample resin. It is confirmed that both crystals of a crystal that has originally been present in the sample resin and a crystal generated by secondary crystallization (in the case where secondary crystallization has occurred) melt with the heat of fusion $\Delta H_m$ (heat absorption) due to the temperature increase in the above Step 2. "$\Delta H_m - \Delta H_c$" in the above formula is a value corresponding to heat of fusion of the crystal that has originally been present in the sample resin. The degree of crystallization of polylactic acid can be obtained by dividing "$\Delta H_m - \Delta_c$" by the heat of fusion ($\Delta_{100\%}$) of the polylactic acid crystal.

When the degree of crystallization of polylactic acid is too high, the obtained resin substrate will presumably be hard, brittle, and likely to crack. Meanwhile, there is a possibility that when the degree of crystallization of polylactic acid is too low, crystallization of the amorphous portion progresses over time and the resin substrate warps. In this embodiment, the degree of crystallization of polylactic acid of 29% or more presumably contributes to suppressing warping of the resin substrate, and the degree of crystallization of polylactic acid of 36% or more presumably contributes to suppressing cracking of the resin substrate. However, in order to suppress warping and cracking of the resin substrate, it is necessary to make not only the degree of crystallization but also the crystallite size within a specific numerical value range. Although the detailed mechanism of action is not clear, the combination of the degree of crystallization within a specific numerical value range and the crystallite size within a specific numerical value range suppress warping and cracking of the resin substrate.

In the copper clad laminate according to this embodiment, the above crystallite size of polylactic acid is 19 nm or more and 26 nm or less, favorably 20 nm or more and 25 nm or less. In order to obtain a resin substrate that is less likely to warp or crack, such a crystallite size is favorable. The crystallite size of polylactic acid is a crystallite size calculated on the basis of a result of X-ray diffraction measurement. The crystallite size is specifically calculated as follows. First, a sample of 20 mm×20 mm×2 mm thickness is cut out from a resin substrate containing polylactic acid of 150 mm×150 mm×2 mm thickness. X-ray diffraction (XRD) measurement is performed on the sample in accordance with the following measurement conditions.

<Measurement Conditions>
  Measuring device: X' Pert PRO MPD manufactured by PANalytical
  X-rays used: Cu Kα rays (whitening: Ni filter)
  X-rays intensity: 45 kV, 40 mA
  Detector: X' Celerator (semiconductor primary detector)
  Optical system arrangement: focused reflection (Bragg-Brentano optical system)
  Measurement range: 2θ=3-90 deg
  Scanning speed: 0.04 deg/sec (step: 0.017 deg)
  Divergence slit: automatic (15 mm)
  Anti-scatter slit: 1 deg Next, a full width at half maximum (β) of a PLA (200) plane diffraction peak obtained as a result of the above XRD measurement and a Bragg angle (θ) of the diffraction line are substituted into the following formula to calculate a crystallite size (D) [nm]. Note that in the following formula, K is a Scherrer constant and is set to 0.9. λ is an X-ray wavelength and is set to 1.54 Å.

$$D = (K\lambda)/\beta\cos\theta$$

The degree of crystallization and crystallite size of polylactic acid can be adjusted by, for example, the temperature of a resin material containing polylactic acid when molding the resin material, the molding temperature, the cooling time of the resin material in the mold, and the like. Further, the degree of crystallization and the crystallite size are adjusted by the die temperature, the cooling roll temperature, the take-up speed, and the like in the case where the method of molding the resin material is extrusion molding and by the die temperature, the blow-up ratio, the take-up speed, and the like in the case of inflation molding.

The resin substrate may contain a resin other than the above polylactic acid. The resin substrate may be, for example, a blend resin of at least 50 mass % or more of polylactic acid and a resin other than polylactic acid. The blend resin may be, for example, a polymer alloy. The resin other than polylactic acid contained in the blend resin may be, for example, biodegradable plastic other than polylactic acid, general-purpose plastic, or engineering plastic. Note that even in the case where a resin other than polylactic acid is contained as a component of the resin substrate, the degree of crystallization and crystallite size obtained by analyzing the resin substrate using the above-mentioned method can be regarded as the degree of crystallization and crystallite size of polylactic acid. Examples of the biodegradable plastic other than polylactic acid include PBS (polybutylene succinate). Examples of the general-purpose plastic include PE (polyethylene), PP (polypropylene), PS (polystyrene), and an ABS resin. Examples of the engineering plastic include PC (polycarbonate).

The resin substrate may contain a material other than the above resin. The material other than the above resin may be, for example, various additives such as an antioxidant, a pigment, and a light stabilizer, and a filler such as glass fiber, carbon fiber, mica, and talc. When analyzing the resin substrate by the above-mentioned method to obtain a crystallite size, a peak of a filler appears in some cases in the case where the resin substrate contains the filler. In this case, the crystallite size of polylactic acid can be obtained by selecting a peak of polylactic acid that does not overlap with the peak of the filler as a reference.

1-2-2. Shape of Resin Substrate

The resin substrate may have a plate shape having no flexibility or may have a film shape or sheet shape having flexibility. That is, the resin substrate may be a rigid resin substrate or a flexible resin substrate. The resin substrate used in this embodiment has a hard plate shape having no flexibility, i.e., it is a rigid resin substrate. However, even in the case where the resin substrate has a film shape or sheet shape having flexibility, i.e., it is a flexible resin substrate, effects equivalent to the effects described in the present specification can be achieved.

In the case where the shape of the resin substrate is a hard plate shape having no flexibility, the thickness of the resin substrate may be, for example, 0.1 mm or more and 3 mm or less or 0.2 mm or more and 2 mm or less. In the case where the shape of the resin substrate is a film shape or sheet shape having flexibility, the thickness of the resin substrate may be, for example, 0.005 mm or more and 0.1 mm or less or 0.02 mm or more and 0.08 mm or less.

1-2-3. Method of Producing Resin Substrate

The resin substrate can be obtained by, for example, a production method including a step of heating a resin material containing at least 50 mass % or more of polylactic acid and molding the molten resin material. The molding may be, for example, injection molding, extrusion molding, or inflation molding, and is favorably injection molding or extrusion molding. That is, the resin substrate is favorably an injection molded body or an extrusion molded body. Molding conditions for producing a resin substrate by injection molding will be described below as an example.

The lower limit value of the temperature of the rein material in injection molding may be, for example, equal to or higher than the melting point of a resin containing polylactic acid. The upper limit value of the temperature of the resin material may be, for example, a temperature at which thermal decomposition of polylactic acid is not induced. The temperature of the resin material in injection molding can be favorably adjusted using numerical values of the degree of crystallization and crystallite size of polylactic acid as indices. That is, the temperature of the resin material may be adjusted such that the degree of crystallization is 29% or more and 36% or less and the crystallite size is 19 nm or more and 26 nm or less. The lower limit value of the temperature of the resin material in injection molding may be, for example, 170° C. or more, 180° C. or more, or 190° C. or more. The upper limit value of the temperature of the resin material may be, for example, 240° C. or less, 220° C. or less, or 210° C. or less. The numerical value range of the temperature of the resin material in injection molding may be a combination selected from the lower limit value and the upper limit value described above, and may be, for example, 170° C. or more and 240° C. or less, 170° C. or more and 220° C. or less, 180° C. or more and 210° C. or less, or 190° C. or more and 200° C. or less. Note that in the present specification, the above temperature of the resin material in injection molding is a temperature of the molten resin measured by a temperature sensor installed at the tip of the cylinder head of the injection molding machine.

The lower limit value of the mold temperature in injection molding may be, for example, a temperature at which the resin material has fluidity such that the mold can be filled with the resin material. The upper limit value of the mold temperature may be, for example, a temperature at which the resin material can be solidified and a molded product (resin substrate) can be taken out of the mold. The mold temperature in injection molding can be favorably adjusted using numerical values of the degree of crystallization and crystallite size of polylactic acid as indices. That is, the mold temperature may be adjusted such that the degree of crystallization is 29% or more and 36% or less and the crystallite size is 19 nm or more and 26 nm or less. The lower limit value of the mold temperature in injection molding may be, for example, 30° C. or more, 40° C. or more, or 50° C. or more. The upper limit value of the mold temperature may be, for example, 130° C. or less, 120° C. or less, 110° C. or less, or 100° C. or less. The numerical value range of the mold temperature in injection molding may be a combination selected from the lower limit value and the upper limit value described above, and may be, for example, 30° C. or more and 130° C. or less, 40° C. or more and 120° C. or less, or 40° C. or more and 110° C. or less, e.g., 50° C. or more and 100° C. or less. Note that in the present specification, the mold temperature in injection molding is a temperature measured by a temperature sensor embedded in the mold. In general, there are two types of molds of a fixed mold and a movable mold. The mold used in Examples described below included a fixed mold and a movable mold, and the set temperatures thereof were the same.

The lower limit value and upper limit value of the cooling time of the resin material in injection molding can be selected, for example, within the range of time during which the resin material is solidified and a molded product (resin substrate) can be taken out of the mold. The cooling time of the resin material in injection molding can be favorably adjusted using numerical values of the degree of crystallization and crystallite size of polylactic acid as indices. That is, the cooling time may be adjusted such that the degree of crystallization is 29% or more and 36% or less and the crystallite size is 19 nm or more and 26 nm or less. The lower limit value of the cooling time of the resin material in injection molding may be, for example, 5 seconds or more, 15 seconds or more, or 20 seconds or more. The upper limit value of the cooling time may be, for example, 120 seconds or less, 100 seconds or less, or 80 seconds or less. The numerical value range of the cooling time of the resin material in injection molding may be a combination selected from the lower limit value and the upper limit value described above, and may be, for example, 5 seconds or more and 120 seconds or less, 15 seconds or more and 100 seconds or less, or 20 seconds or more and 80 seconds or less. Note that in the present specification, the cooling time of the resin material in injection molding is a time period from when injecting the resin material into the mold to when opening the mold and taking out a molded product (resin substrate).

1-3. Adhesive Layer

The adhesive layer included in the copper clad laminate according to this embodiment is stacked on at least one side of the resin substrate. The adhesive layer may be stacked on both sides of the resin substrate. That is, the copper clad laminate according to this embodiment includes one or two adhesive layers.

The adhesive layer is a layer that contains an adhesive and is for bonding the resin substrate and a copper foil layer described below. The adhesive used in the adhesive layer may be, for example, a thermosetting resin. The adhesive layer is favorably a sheet containing an adhesive (so-called bonding sheet).

The thickness of the adhesive layer is favorably larger than that of the copper foil layer described below. The thickness of the adhesive layer is favorably 10 μm or more and 100 μm or less, more favorably 15 μm or more and 50 μm or less, and still more favorably 20 μm or more and 40 μm or less.

1-4. Copper Foil Layer

The copper foil layer included in the copper clad laminate according to this embodiment is stacked on the adhesive layer, and is bonded to the resin substrate via the adhesive layer. That is, the copper clad laminate according to this embodiment includes one or two copper foil layers. The number of copper foil layers is the same as the number of adhesive layers.

The copper foil layer is a layer made of a copper foil. In the present specification, the copper foil includes a copper alloy foil. The copper foil may be, for example, an electrolytic copper foil or a rolled copper foil. Further, the copper foil may be subjected to surface treatment one or two or more times. The surface treatment may be, for example, roughening treatment or treatment for imparting rust resistance, heat resistance, and chemical resistance.

The thickness of the copper foil layer is favorably 1 μm or more and 50 μm or less, more favorably 1 μm or more and 30 μm or less, and still more favorably 1 μm or more and 20 μm or less.

1-5. Method of Producing Copper Clad Laminate

The copper clad laminate according to this embodiment can be obtained by, for example, a production method including a step of stacking an adhesive layer and a copper foil layer in this order on at least one side of a resin substrate and then heating and pressurizing them. By the heating and pressurizing, the copper foil layer is bonded to the resin substrate via the adhesive layer.

In the case where the copper clad laminate according to this embodiment is a single-sided copper clad laminate, in the above production method, a step of stacking an adhesive layer and a copper foil layer in this order only on one side of a resin substrate and then heating and pressurizing them is performed. In the case where the copper clad laminate according to this embodiment is a double-sided copper clad laminate, in the above production method, a step of stacking an adhesive layer and a copper foil layer in this order on both sides of a resin substrate and then heating and pressuring them is performed.

The temperature, pressure, and heating and pressurizing time in the heating and pressurizing may be appropriately set by those skilled in the art. For example, the temperature may be set in a range of 60° C. or more and 200° C. or less, the pressure may be set in a range of 0.1 MPa or more and 5 MPa or less, and the heating and pressurizing time may be set in a range of 0.1 hour or more and 5 hours or less.

The copper clad laminate described above in detail may be a rigid copper clad laminate or a flexible copper clad laminate.

2. Printed Wiring Board

A printed wiring board according to an embodiment of the present technology is formed using the above copper clad laminate. The copper clad laminate is a copper clad laminate as described in the above 1., and the description also applies to the printed wiring board according to this embodiment.

The printed wiring board according to this embodiment may be, for example, a single-sided printed wiring board having a circuit pattern on only one side, a double-sided printed wiring board having a circuit pattern on both sides, or a multiplayer printed wiring board having a three or more circuit layers.

The single-sided printed wiring board can be produced by, for example, forming a resist pattern on a surface of a copper foil layer of a single-sided copper clad laminate, removing unnecessary portions of the copper foil other than the resist pattern by etching, and then peeling off the resist pattern. The double-sided printed wiring board can be produced using, for example, a double-sided copper clad laminate by a procedure similar to that for the above single-sided printed wiring board. The multiplayer printed wiring board can be produced, for example, as follows. First, an adhesive layer and a single-sided copper clad laminate are stacked in this order on both sides of a double-sided copper clad laminate. An adhesive layer and a single-sided copper clad laminate may be further stacked one or two or more times as necessary. Next, heating and pressurizing treatment is performed thereon to bond the respective layers. After forming a through hole by drilling, the through hole is plated to electrically connect a plurality of copper foil layers to each other. A resist pattern is formed on both surfaces of the outermost layer, unnecessary portions of the copper foil other than the resist pattern are removed by etching, and then, the resist pattern is finally peeled off. Note that in the multiplayer printed wiring board, one or two or more inner copper foil layers may have a circuit pattern. That is, in the production of the multiplayer printed wiring board, a step of forming a resist pattern on a surface of one or two or more inner copper foil layers, removing unnecessary portions of the copper foil other than the resist pattern by etching, and then peeling off the resist pattern may be performed.

The printed wiring board according to this embodiment may be a rigid printed wiring board or a flexible printed wiring board.

3. Conclusion

The copper clad laminate and printed wiring board according to the present technology each include a resin substrate containing polylactic acid that is a biodegradable resin. That is, the copper clad laminate and printed wiring board are partially made of a biodegradable material. Even if the copper clad laminate or printed wiring board is leaked into the natural environment due to unforeseen circumstances such as accidents and disasters, part thereof can be biodegraded, and thus the burden on the natural environment can be reduced as compared with the existing products made entirely of a non-biodegradable material.

Further, warping and/or cracking occurs in some cases when polylactic acid is mixed in a resin substrate, but in the present technology, warping and cracking can be suppressed by controlling the degree of crystallization and crystallite size of polylactic acid within a specific numerical value range.

In order to produce a resin substrate whose warping and cracking has been suppressed, adjusting the molding conditions for the resin substrate is possible. However, in the existing technology, there is no indication of how to adjust a plurality of molding conditions, and it is not easy to find appropriate molding conditions. Further, a practical problem that the molding conditions change when the molding machine differs even if the same mold is used can occur. In accordance with the present technology, it only needs to adjust the molding conditions for the resin substrate using the degree of crystallization and crystallite size of polylactic acid as indices, and it is possible to efficiently produce a favorable resin substrate.

4. Examples

Although the present technology will be more specifically described below by way of Examples, the present technology is not limited to these Examples.

4-1. Preparation of Printed Wiring Board for Evaluation

Printed wiring board for evaluation according to Examples 1 to 5 and Comparative Examples 1 to 12 were prepared by the procedure shown below.

(1) Preparation of Resin Substrate

A resin substrate of 50 mm×30 mm×1 mm thickness was obtained using the following polylactic acid A or B as a resin material by injection molding. The molding conditions (the temperature of the resin material, the mold temperature, and the cooling time of the resin material) in injection molding were as described in Tables 1 and 2.

<Polylactic Acid (Resin Material)>

[Polylactic Acid A]

"TERRAMAC (registered trademark) TE-8005MT9" manufactured by UNITIKA Ltd.

The content ratio of polylactic acid: 80%

[Polylactic Acid B]

"LUMINY (registered trademark) L105" manufactured by Total Corbion PLA

The optical purity of L-lactic acid: 99% or more (2) Calculation of Degree of Crystallization Polylactic Acid Differential scanning calorimetry was performed using the above polylactic acid A or B as a sample resin, and the degree of crystallization of the above polylactic acids A and B was calculated on the basis of the results of the differential scanning calorimetry. In this Example, the degree of crystallization of polylactic acids A and B was obtained by the calculation method described in the above 1-2-1.

(3) Calculation of Crystallite Size of Polylactic Acid

A resin substrate for a sample of 150 mm×150 mm×2 mm thickness was prepared under the same molding conditions as those in the above (1). A sample of 20 mm×20 mm×2 mm thickness was cut out from the resin substrate for a sample.

X-ray diffraction measurement was performed on the sample, and the crystallite size of polylactic acid was calculated on the basis of the result of the X-ray diffraction measurement. In this Example, the crystallite size of polylactic acid was obtained by the calculation method described in the above 1-2-1.

(4) Preparation of Single-Sided Copper Clad Laminate

An adhesive layer (halogen-free adhesive sheet "NIKAFLEX SAFS" manufactured by NIKKAN INDUSTRIES Co., Ltd., 25 μm thickness) and a copper foil layer (rolled copper foil, 9 μm thickness) were stacked in this order only on one side of the resin substrate obtained in the above (1), and heating and pressurizing treatment was performed thereon under the conditions of a temperature of 80° C., a pressure of 0.5 MPa, and heating and pressurizing time of 1 hour to bond the copper foil layer to only one side of the resin substrate. As a result, a single-sided copper clad laminate was obtained.

(5) Preparation of Double-Sided Copper Clad Laminate

An adhesive layer (halogen-free adhesive sheet "NIKAFLEX SAFS" manufactured by NIKKAN INDUSTRIES Co., Ltd., 25 μm thickness) and a copper foil layer (rolled copper foil, 9 μm thickness) were stacked in this order on both sides of the resin substrate obtained in the above (1), and heating and pressurizing treatment was performed thereon under the conditions of a temperature of 80° C., a pressure of 0.5 MPa, and heating and pressurizing time of 1 hour to bond the copper foil layer on both sides of the resin substrate. As a result, a double-sided copper clad laminate was obtained.

(6) Preparation of Printed Wiring Board for Evaluation

An adhesive layer (halogen-free adhesive sheet "NIKAFLEX SAFS" manufactured by NIKKAN INDUSTRIES Co., Ltd., 25 μm thickness) and the single-sided copper clad laminate obtained in the above (4) were stacked in this order on both sides of the double-sided copper clad laminate obtained in the above (5) such that the side of the single-sided copper clad laminate that does not include the copper foil layer is in contact with the above adhesive layer. After that, heating and pressurizing treatment was performed thereon under the conditions of a temperature of 80° C., a pressure of 0.5 MPa, and heating and pressurizing time of 1 hour to bond the respective layers. As a result, a printed wiring board for evaluation in which three resin substrate layers (PLA) and four copper foil layers (Cu) were bonded via adhesive layers in the order of Cu/PLA/Cu/PLA/Cu/PLA/Cu was obtained. In the printed wiring board for evaluation, etching and formation of a through hole were not performed.

4-2. Evaluation of Printed Wiring Board for Evaluation

The printed wiring boards for evaluation according to Examples 1 to 5 and Comparative Examples 1 to 12 obtained in the above 4-1, were evaluated as follows.

(1) Evaluation of Warping

The printed wiring board for evaluation obtained in the above 4-1, was left to stand at 23° C. for 24 hours. Subsequently, a CNC image measurement system ("NEXIV VMZ-R4540" manufactured by Nikon Solutions Co., Ltd.) was used to measure the four corners of the printed wiring board for evaluation, plane correction was performed, and the maximum value of Max-Min was used as the value of warpage. The same printed wiring board for evaluation was measured three times in total, and the average value of warpage was calculated. On the basis of the average value of warpage, the presence or absence of warpage of the printed wiring board for evaluation was evaluated as follows.

(Average Value of Warpage): (Presence or Absence of Warpage)

0.4 mm or more: Present 0.2 mm or more and less than 0.4 mm: Slightly present

Less than 0.2 mm: None (2) Evaluation of Cracking

The printed wiring board for evaluation obtained in the above 4-1. was left to stand at 23° C. for 24 hours, and then, the presence or absence of cracking at the end portion was visually checked. In the case where cracking at the end portion was visually confirmed, it is evaluated as "Present". In the case where cracking at the end portion was not visually confirmed, it is evaluated as "None".

(3) Overall Evaluation

Regarding the printed wiring board for evaluation, those with no warping and no cracking were evaluated as non-defective products (OK), and the others were evaluated as defective products (NG).

The type of polylactic acid used for the resin substrate, the molding conditions of injection molding during preparation of the resin substrate, the degree of crystallization and crystallite size of polylactic acid, and evaluation results are shown in the following Tables 1 and 2.

TABLE 1

|  |  | Unit | Example 1 | Example 2 | Example 3 | Comparative Example 1 | Comparative Example 2 |
|---|---|---|---|---|---|---|---|
|  | Type of polylactic acid | — | Polylactic acid A | | | | |
| Molding conditions | Temperature of resin material | ° C. | 200 | 200 | 200 | 200 | 200 |
|  | Mold temperature | ° C. | 100 | 100 | 100 | 100 | 80 |
|  | Cooling time of resin material | sec | 30 | 45 | 60 | 150 | 30 |
| Degree of crystallization of polylactic acid | | % | 30 | 32 | 34 | 38 | 28 |
| Crystallite size of polylactic acid | | nm | 20 | 22 | 24 | 27 | 18 |
| Evaluation | Presence or absence of warpage | — | None | None | None | Present | Slightly present |
|  | Presence or absence of cracking | — | None | None | None | Present | None |
|  | Overall evaluation | — | OK | OK | OK | NG | NG |

|  |  | Comparative Example 3 | Comparative Example 4 | Comparative Example 5 | Comparative Example 6 | Comparative Example 7 |
|---|---|---|---|---|---|---|
|  | Type of polylactic acid | Polylactic acid A | | | | |
| Molding conditions | Temperature of resin material | 200 | 200 | 190 | 190 | 190 |
|  | Mold temperature | 120 | 120 | 100 | 100 | 90 |
|  | Cooling time of resin material | 30 | 60 | 60 | 150 | 60 |

TABLE 1-continued

|  |  | | | | | |
|---|---|---|---|---|---|---|
| Degree of crystallization of polylactic acid | | 25 | 25 | 31 | 38 | 33 |
| Crystallite size of polylactic acid | | 16 | 22 | 28 | 23 | 17 |
| Evaluation | Presence or absence of warpage | Present | None | None | None | Present |
| | Presence or absence of cracking | None | Present | Present | Present | Present |
| | Overall evaluation | NG | NG | NG | NG | NG |

TABLE 2

| | | Unit | Example 4 | Example 5 | Comparative Example 8 | Comparative Example 9 | Comparative Example 10 | Comparative Example 11 | Comparative Example 12 |
|---|---|---|---|---|---|---|---|---|---|
| | Type of polylactic acid | — | | | | Polylactic acid B | | | |
| Molding conditions | Temperature of resin material | °C. | 200 | 200 | 200 | 200 | 190 | 190 | 180 |
| | Mold temperature | °C. | 60 | 50 | 100 | 50 | 60 | 100 | 50 |
| | Cooling time of resin material | sec | 30 | 30 | 60 | 60 | 45 | 150 | 30 |
| Degree of crystallization of polylactic acid | | % | 35 | 33 | 42 | 34 | 33 | 37 | 28 |
| Crystallite size of polylactic acid | | nm | 25 | 23 | 40 | 38 | 18 | 22 | 21 |
| Evaluation | Presence or absence of warpage | — | None | None | Present | Present | None | Present | None |
| | Presence or absence of cracking | — | None | None | Present | Present | Present | None | Present |
| | Overall evaluation | — | OK | OK | NG | NG | NG | NG | NG |

From the results of Comparative Examples 1 to 12, it can be seen that warping or cracking is caused by the degree of crystallization of polylactic acid being 28% or less or 37% or more or the crystallite size of polylactic acid being 18 nm or less or 27 nm or more. The degree of crystallization of polylactic acid being 29% or more and 36% or less and the crystallite size of polylactic acid being 19 nm or more and 26 nm or less presumably contribute to suppression of warping and cracking.

The present technology may also take the following configurations.

[1] A copper clad laminate, including:
a resin substrate;
an adhesive layer; and
a copper foil layer,
the adhesive layer and the copper foil layer being stacked in this order on at least one side of the resin substrate,
the resin substrate containing at least 50 mass % or more of polylactic acid,
the degree of crystallization of the polylactic acid calculated on a basis of a result of differential scanning calorimetry being 29% or more and 36% or less,
a crystallite size of the polylactic acid calculated on a basis of a result of X-ray diffraction measurement being 19 nm or more and 26 nm or less.

[2] The copper clad laminate according to [1], wherein the degree of crystallization of the polylactic acid is 30% or more and 35% or less.

[3] The copper clad laminate according to [1] or [2], wherein the crystallite size of the polylactic acid is 20 nm or more and 25 nm or less.

[4] The copper clad laminate according to any one of [1] to [3], wherein
the resin substrate is an injection molded body.

[5] A printed wiring board formed using the copper clad laminate according to any one of [1] to [3].

The invention claimed is:

1. A copper clad laminate, comprising:
a resin substrate;
an adhesive layer; and
a copper foil layer,
the adhesive layer and the copper foil layer being stacked in this order on at least one side of the resin substrate,
the resin substrate containing at least 50 mass % or more of polylactic acid,
the degree of crystallization of the polylactic acid calculated on a basis of a result of differential scanning calorimetry being 29% or more and 36% or less,
a crystallite size of the polylactic acid calculated on a basis of a result of X-ray diffraction measurement being 19 nm or more and 26 nm or less.

2. The copper clad laminate according to claim 1, wherein the degree of crystallization of the polylactic acid is 30% or more and 35% or less.

3. The copper clad laminate according to claim 1, wherein the crystallite size of the polylactic acid is 20 nm or more and 25 nm or less.

4. The copper clad laminate according to claim 1, wherein the resin substrate is an injection molded body.

5. A printed wiring board formed using the copper clad laminate according to claim 1.

* * * * *